US006961276B2

(12) United States Patent
Atallah et al.

(10) Patent No.: US 6,961,276 B2
(45) Date of Patent: Nov. 1, 2005

(54) RANDOM ACCESS MEMORY HAVING AN ADAPTABLE LATENCY

(75) Inventors: Francois Ibrahim Atallah, Raleigh, NC (US); James Norris Dieffenderfer, Apex, NC (US); Jeffrey H. Fischer, Cary, NC (US); Michael Thomas Fragano, Essex Junction, VT (US); Daniel Stephen Geise, South Burlington, VT (US); Jeffery Howard Oppold, Richmond, VT (US); Michael R. Ouellette, Westford, VT (US); Neelesh Govindaraya Pai, Williston, VT (US); William Robert Reohr, Ridgefield, CT (US); Joel Abraham Silberman, Somers, NY (US); Thomas Philip Speier, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 10/664,789

(22) Filed: Sep. 17, 2003

(65) Prior Publication Data

US 2005/0063211 A1 Mar. 24, 2005

(51) Int. Cl.[7] .................................................. G11C 7/02
(52) U.S. Cl. ........................ 365/207; 201/711; 201/128
(58) Field of Search ................................ 365/207, 201, 365/230.06; 711/128

(56) References Cited

U.S. PATENT DOCUMENTS

| | | | | |
|---|---|---|---|---|
| 5,835,934 A | | 11/1998 | Tran | |
| 5,848,428 A | * | 12/1998 | Collins | 711/127 |
| 6,021,461 A | | 2/2000 | Dhong et al. | |
| 6,076,140 A | | 6/2000 | Dhong et al. | |
| 6,314,051 B1 | * | 11/2001 | Farmwald et al. | 365/233 |
| 6,412,059 B1 | * | 6/2002 | Matsuyama | 711/204 |
| 6,687,789 B1 | * | 2/2004 | Keller et al. | 711/128 |

OTHER PUBLICATIONS

M.D. Powell et al., "Reducing Set–Associative Cache Energy via Way–Prediction and Selective Direct–Mapping," Proceedings of the 34th International Symposium on Microarchitecture (MICRO), 12 pages, 2001.

* cited by examiner

*Primary Examiner*—Anh Phung
(74) *Attorney, Agent, or Firm*—Ryan, Mason & Lewis, LLP

(57) ABSTRACT

A random access memory circuit comprises a plurality of memory cells and at least one decoder coupled to the memory cells, the decoder being configurable for receiving an input address and for accessing one or more of the memory cells in response thereto. The random access memory circuit further comprises a plurality of sense amplifiers operatively coupled to the memory cells, the sense amplifiers being configurable for determining a logical state of one or more of the memory cells. A controller coupled to at least a portion of the sense amplifiers is configurable for selectively operating in at least one of a first mode and a second mode. In the first mode of operation, the controller enables one of the sense amplifiers corresponding to the input address and disables the sense amplifiers not corresponding to the input address. In the second mode of operation, the controller enables substantially all of the sense amplifiers. The memory circuit advantageously provides an adaptable latency by controlling the mode of operation of the circuit.

22 Claims, 6 Drawing Sheets

RANDOM ACCESS MEMORY HAVING AN ADAPTABLE LATENCY

FIELD OF THE INVENTION

The present invention relates generally to memory devices, and more particularly relates to a random access memory (RAM) architecture for implementing a multiple-way set associative cache having an adaptable latency.

BACKGROUND OF THE INVENTION

High-performance cache memories are used widely in computer systems to couple high-speed processors to slower memory systems. Cache memories typically serve as high-speed buffers which hold a subset of the data from the computer system memories that are temporarily required by the processors. High-performance cache memories dissipate significant dynamic energy due to charging and discharging of highly capacitive bit lines and sense amplifiers. As a result, caches account for a significant portion of the overall power consumption in an integrated circuit (IC) device employing such caches.

To achieve low miss rates for running typical applications, modem processors often employ set-associative caches rather than direct-mapped caches. In contrast to direct-mapped caches, set-associative cache implementations provide more than one location to temporarily store data from the system memory. While more flexible placement of data within the set-associative cache generally results in lower miss rates and improved system performance, it also increases the number of potential locations that must be searched in order to locate the requested data. Consequently, since the number of sense amplifiers that are enabled at any given time is increased, the overall power consumption of the IC device is increased accordingly.

Many set-associative cache implementations achieve low latency by probing all of the data ways concurrently with the tag lookup. Since the output of only one of the ways, namely, the matching way, is ultimately used, energy spent accessing the other way(s) is wasted. Eliminating the wasted energy by retrieving the data after the tag lookup substantially increases cache latency and is therefore an unacceptable approach for many high-performance cache implementations.

Another approach disclosed in U.S. Pat. No. 5,848,428 to Collins reduces power consumption of the concurrent lookup of the set-associative cache by enabling only those sense amplifiers associated with the matching data way. The other sense amplifiers in the data array corresponding to non-matching (i.e., missed) ways are disabled and hence consume essentially no additional power. In this manner, a partial energy savings is realized in the data array. However, using the cache scheme disclosed by Collins undesirably increases cache latency for many implementations since the tag lookup must first determine the matching way before the sense amplifiers of the data array can be enabled. Thus, instead of propagating the requested data forward (e.g., to a multiplexer associated with the way selection), the data undesirably stalls at the sense amplifier stage.

There exists a need, therefore, in the field of memory systems for an architecture for implementing a memory cache which provides a flexible tradeoff between power consumption and cache latency in the memory cache, depending on the desired application in which the memory cache is employed.

SUMMARY OF THE INVENTION

The present invention is a multiple-way cache memory circuit which advantageously provides an adaptable latency.

For example, in applications and systems where power consumption is not critical but minimizing cache latency is important, the cache memory circuit of the present invention may be operated in a high-speed mode, wherein essentially all of the data ways are accessed concurrently with the tag lookup. In applications and systems where power consumption is critical (e.g., battery operated devices, etc.), the cache memory circuit can be operated in a power-saving mode, wherein only the data ways corresponding to the requested data are accessed. Furthermore, the cache memory circuit of the invention is preferably configurable for selectively mixing the two modes of operation to obtain a desired tradeoff between speed and power consumption based, for example, on certain characteristics associated with the cache memory circuit (e.g., physical layout, clock frequency, etc.).

In accordance with one aspect of the present invention, a random access memory circuit comprises a plurality of memory cells and at least one decoder coupled to the memory cells, the decoder being configurable for receiving an input address and for accessing one or more of the memory cells in response thereto. The random access memory circuit further comprises a plurality of sense amplifiers operatively coupled to the memory cells, the sense amplifiers being configurable for determining a logical state of one or more of the memory cells. A controller coupled to at least a portion of the sense amplifiers is configurable for selectively operating in at least one of a first mode and a second mode. In the first mode of operation, the controller enables one of the sense amplifiers corresponding to the input address and disables the sense amplifiers not corresponding to the input address. In the second mode of operation, the controller enables substantially all of the sense amplifiers.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein in the context of an illustrative multiple-way set-associative cache memory circuit. It should be appreciated, however, that the invention is not limited to this or any particular memory architecture. Rather, the invention is more generally applicable to techniques for advantageously controlling an operating mode of a random access memory circuit so as to selectively adapt a latency and/or power consumption of the memory circuit to a particular application as desired.

For example, in applications where power consumption is not critical but minimizing latency is important, the memory circuit of the present invention may be operated in a first mode, wherein substantially all of the data ways are accessed concurrently with the tag lookup. In applications and systems where power consumption is critical (e.g., battery operated devices, etc.), the memory circuit can be operated in a second mode, wherein only the data way(s) corresponding to the requested data is accessed. Furthermore, in accordance with the invention, the memory circuit is preferably configurable for selectively combining the two modes of operation in order to obtain a desired tradeoff between speed and power consumption in the memory circuit. The mode of operation of the memory circuit may be controlled, either manually, automatically, or a combination thereof, based on, for example, certain criteria and/or characteristics associated with the memory circuit (e.g., physical layout, clock frequency, supply voltage, etc.).

Cache memory is typically implemented using static random access memory (SRAM), which, although substantially faster, is significantly more costly than dynamic random access memory (DRAM) often used for implementing main memory in a computer system. By placing frequently accessed data in the faster cache memory, a microprocessor can retrieve needed data from the cache memory rather than the slower DRAM during memory cycles. A cache thereby serves as an intermediate source of faster memory, substantially smaller than main memory, which allows a processor to run with fewer wait states when the requested data is stored in the cache memory, often referred to as a "hit." When the requested data is not found in the cache memory, often referred to as a "miss," a cache controller retrieves the data, depending on the implementation, from either the next level of cache memory or the main memory.

Figure 1:
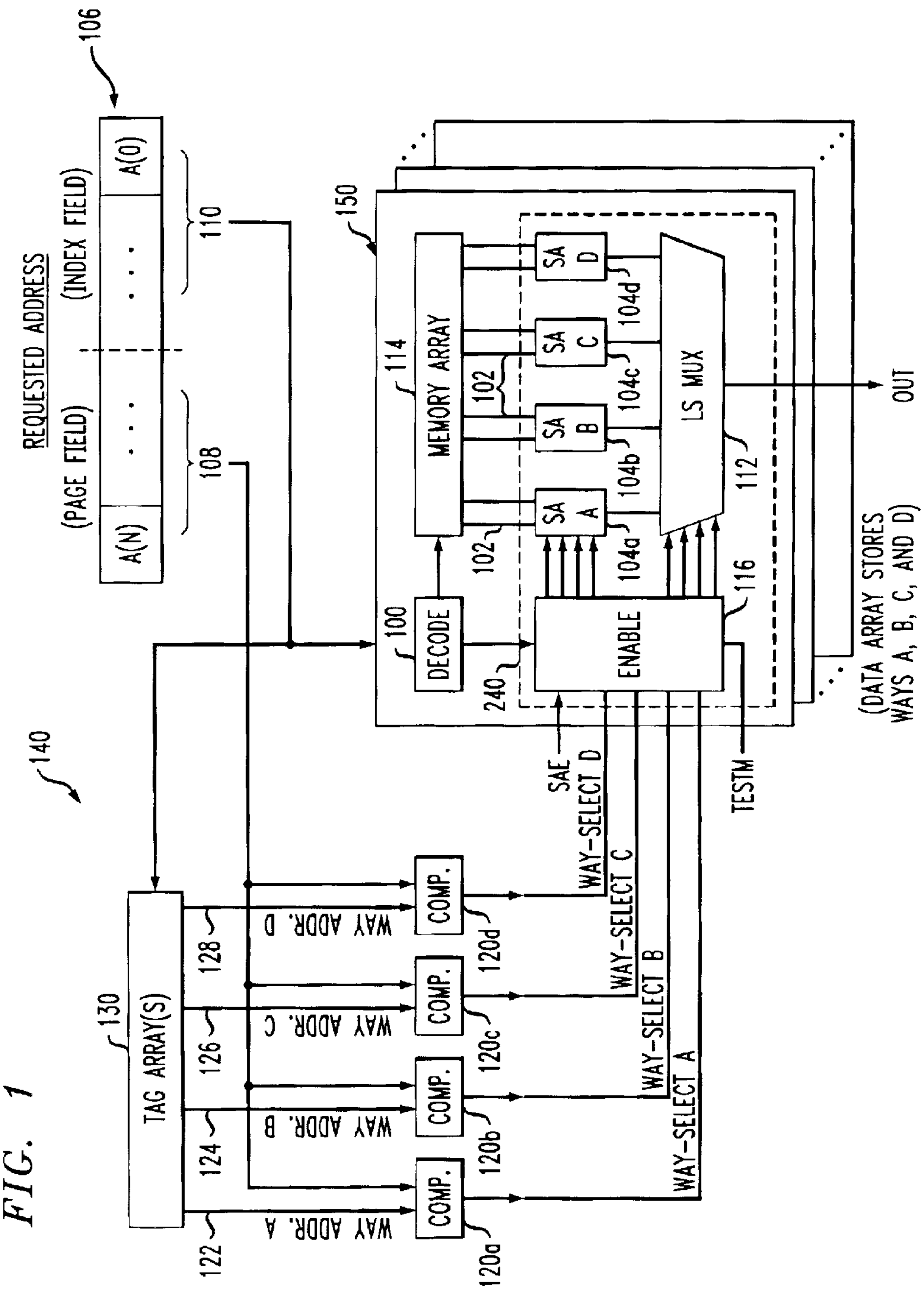
FIG. 1 is a circuit diagram illustrating at least a portion of an exemplary memory circuit in which the techniques of the present invention are implemented.

FIG. 1. depicts at least a portion of an exemplary cache memory circuit 140 in which the techniques of the present invention are implemented. The cache memory circuit 140 preferably comprises a four-way set-associative cache memory architecture. It is to be appreciated that the present invention is not limited to the particular memory architecture depicted, nor is it limited to a particular number of data ways. As will be understood by those skilled in the art, a data way logically represents a column (i.e., bank) of memory elements in a matrix and a data set logically represents a row of memory elements in the matrix. A matrix may be implemented as one or more memory arrays, each memory array comprising a plurality of bit lines associated therewith, with each bit line coupled to a plurality of memory cells in the memory array. Thus, a given data way may correspond to a plurality of bits in the memory array. A set address identifies a subset of the plurality of bits within each way.

The exemplary cache memory circuit 140 comprises tag RAM 130, implemented as one or more tag arrays, and data RAM 150, implemented as one or more late-select RAM (150*a*, 150*b*, 150*c*, . . . 150*p* shown in FIG. 5), in accordance with one embodiment of the invention. The terms late-select and way-select, which are terms of art, are intended to be used herein interchangeably with one another. The cache memory circuit 140 further comprises a plurality of comparators 120*a*, 120*b*, 120*c* and 120*d*, each comparator associated with a corresponding way 122, 124, 126 and 128, respectively, in the tag RAM 130. It is to be appreciated that each of the comparators 120*a* through 120*d* may, in fact, comprise more than one comparator circuit, each comparator circuit corresponding to a bit associated with a given way.

A requested memory address 106, which may be presented by a processor (not shown), may include a page field 108, corresponding to a page in main memory, and an index field 110, identifying a unique address within the page. Each field 108, 110 comprises a varying number of address bits that depends, at least in part, on the size of the cache memory and/or the size of main memory. In a four-way set-associative cache memory architecture, each cache index (or set) has four corresponding cache data RAM storage locations, which are comprised of one or more memory cells, and four corresponding tags in the tag RAM, which are also comprised of one or more memory cells. If only one of the four locations is already occupied by data corresponding to another tag, then one of the other three locations can be used to store new data retrieved from main memory during a subsequent update of the cache triggered by a miss. When all of the locations for a particular index are already occupied, and a miss triggers the storage of new data to the same index in the cache data RAM, one of several conventional methodologies (e.g., least-recently used (LRU), etc.) known to those skilled in the art can be used to determine which of the old data residing in the four locations will be replaced by the new data.

The cache tag RAM 130 holds the page fields of the subset of main memory addresses stored in the cache data RAM 150. Each page field stored in the tag RAM 130 has a corresponding data entry stored under a common index address in the data RAM 150. As apparent from the figure, the index field 110 of the requested address 106 is coupled into both the cache data RAM 150 and cache tag RAM 130. When the cache memory circuit 140 receives a requested address 106, the tag RAM 130 is accessed using the given index field 110 to determine whether or not the data RAM 150 holds the data corresponding to the requested address.

For a given index field 110, the page field 108 of the requested address 106 must match the page field of the address already stored in the tag RAM 130 when cache data RAM 150 holds the data corresponding to the requested address. To accomplish this, the page field 108 of the requested address 106 is coupled to a first input of each of the comparators 120*a* through 120*d*. A second input of the comparators 120*a* through 120*d* is coupled to a corresponding way 122, 124, 126, 128, respectively, in the tag RAM 130. When the two inputs to a given comparator are substantially equal to one another, the comparator preferably generates a logic high (e.g., "1") output signal. The outputs from the comparators 120*a* through 120*d* preferably form way-select signals, namely, way-select A, way-select B, way-select C and way-select D, respectively, used by the cache data RAM 150, as will be explained in further detail below. In the exemplary cache memory circuit 140, more than one page field per index field is compared substantially concurrently to determine whether or not one of the page fields stored in the tag RAM 130 matches the page field 108 of the requested address 106.

The cache data RAM 150 in the exemplary cache memory circuit 140 comprises one or more late-select RAM, as previously stated. Each of the late-select RAM preferably includes an address decode circuit 100, a memory array 114 including a plurality of memory cells (not shown) and a plurality of bit lines 102 for accessing one or more of the memory cells, and a late-select interface circuit 240. The plurality of bit lines 102 from the memory array 114 are coupled to the late-select interface circuit 240. As in a conventional RAM, the bit lines 102 may be arranged in a vertical or column dimension and are used, at least in part, to read a logical state of one or more of the memory cells in the memory array 114. Memory array 114 may also include row and column read-write drivers (not shown) for selectively reading and/or writing the logical states of the memory cells, as will be understood by those skilled in the art. The invention, however, is not limited to a particular size or organization of the memory array 114. The address decode circuit 100, preferably receives as input the index field 110 of the requested address 106 and generates one or more signals that may be used to access selected memory cells in the memory array 114.

The late-select interface circuit 240, which will be described in further detail below in conjunction with FIGS. 2A and 2B, preferably comprises a plurality of sense amplifiers 104*a* (SA A), 104*b* (SA B), 104*c* (SA C) and 104*d* (SA D), each of the sense amplifiers corresponding to one of the bit lines 102 in the memory array 114. The memory cells in the memory array 114 may be configured in a differential arrangement, and thus rather than using a single bit line, a pair of bit lines may be employed for each column of memory cells in the array, as shown. The late-select interface circuit 240 further includes a late-select multiplexer (LS Mux) 112, or alternative multiplexing circuitry, and enable circuitry 116 coupled to the sense amplifiers 104*a* through 104*d* and to the LS Mux 112. The enable circuitry 116 receives as input the way-select signals from comparators 120*a* through 120*d* and a sense amplifier enable (SAE) signal, and generates output signals for operatively enabling one or more of sense amplifiers 104*a* through 104*d* and for selecting which one of the sense amplifiers to propagate through the LS Mux 112 to an output OUT of the cache data RAM 150. The enable circuitry 116 may also receive as inputs other control signals, such as, for example, a test mode control signal TESTM for providing additional features of the memory circuit 140, as will be described in further detail below.

In accordance with one embodiment of the present invention, cache ways are preferably interleaved within the cache data RAM 150 in order to reduce wiring congestion. The interleaving of ways within the data RAM 150 may be accomplished, for example, by retrieving one bit of way A from memory cells corresponding to sense amplifier 104*a*, retrieving one bit of way B from memory cells corresponding to sense amplifier 104*b*, retrieving one bit of way C from memory cells corresponding to sense amplifier 104*c*, and retrieving one bit of way D from memory cells corresponding to sense amplifier 104*d*. Way-select signals A through D are preferably used for controlling which bit of way addresses A through D are propagated through to the output of the late-select multiplexer 112. Since a way address may comprise a plurality of bits, the bits associated with a given way address may be read from a plurality of memory cells by a plurality of sense amplifiers connected to the memory cells via the bit lines 102. The enable circuitry 116 may be configured such that a particular way-select signal may selectively enable or disable the sense amplifier corresponding to that particular way.

The interleaved partitioning of the ways minimizes wiring congestion since the multiplexing, required by the logical specification of the set-associative cache, can be realized by the late-select multiplexer 112 which is local to each late-select RAM comprised in cache data RAM 150. The late-select multiplexer 112 is referred to as such since the way-select signals typically arrive later in time than data with respect to the RAM access. It should be noted that, in a system mode (i.e., normal or non-test mode) of operation, described in further detail herein below, the late-select multiplexer 112 preferably selects way-select signals, which are developed outside the data RAM 150, for transmission to its output, whereas in a test mode of operation, the late-select multiplexer selects a decoded self-test address, which may be developed by decoder 100 inside the data RAM in conjunction with array built-in self test (ABIST), for transmission to its output.

A goal of the present invention is to minimize latency through the late-select interface circuit 240 while minimizing power consumption in the data RAM 150 of the set-associative cache. However, these two objectives are generally mutually exclusive. The timing in a conventional set-associative cache for a given architecture can profoundly affect the implementation of the cache data RAM. In some set-associative cache implementations, the tag search may provide way-select information prior to the activation of the sense amplifiers. In these implementations, a power savings may be realized by not enabling sense amplifiers and corresponding circuitry associated with non-selected ways (see, e.g., U.S. Pat. Nos. 5,848,428, 6,076,140, and 6,021,461). In any data cache access, generally only one way out of n possible ways needs to be accessed during a given memory cycle, where n is an integer greater than one. While the aforementioned power savings approach may apply to a subset of designs, it cannot be universally applied to all designs, particularly those related to high-speed caches (e.g., L1 caches).

Often, the sense amplifiers and corresponding circuitry associated with all ways, both selected and nonselected, are preferably enabled in advance of the development of the way-select signals so that data can advance to the late-select multiplexer without delay. In general, a simultaneous access of the tag array and data array is intended to minimize latency. Like any speculative operation used to improve performance, the simultaneous access of ways within the data cache proceeds unencumbered and in parallel with the tag search. As known by those skilled in the art, a tag search typically includes accessing the tag array followed by an address comparison. The tag search may not always resolve the way before the time the sense amplifiers are ready to be enabled, thus creating a wait state which increases latency. Often, the way resolution from the tag search, represented by the way-select signals, are available just in time to decide which way is muxed into an output register.

Figure 2A:
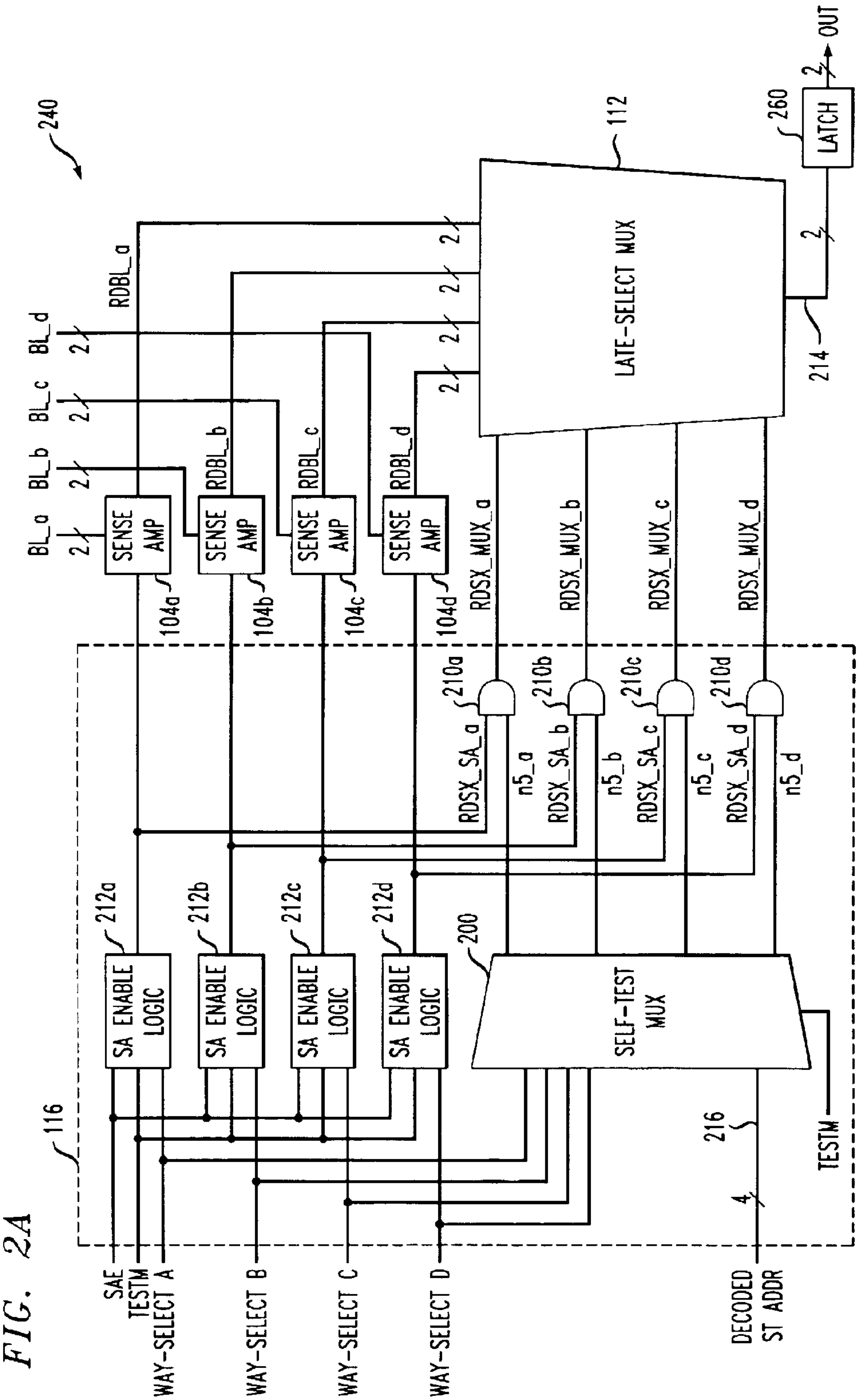
FIG. 2A is a schematic diagram illustrating an exemplary late-select interface circuit that may be employed in the memory circuit of FIG. 1, in accordance with one embodiment of the present invention.

FIG. 2A illustrates at least a portion of an exemplary late-select interface circuit 240 that is configured to adapt to both potential timing scenarios for the way-select signals discussed above and may be employed in the memory circuit 140 shown in FIG. 1, in accordance with one embodiment of the invention. The late-select interface circuit 240 is preferably implemented locally within each late-select RAM comprised in cache data RAM 150 to reduce wiring congestion. It is to be appreciated that the present invention contemplates various alternative circuits that may be used for implementing the functionality of the late-select interface circuit 240, as will become apparent to those skilled in the art. As previously stated, an important aspect of the present invention is the ability of the late-select RAM architecture to provide, among other features, the adaptability to optimize a tradeoff between latency and power consumption in the cache memory circuit 140.

As described previously, the exemplary late-select interface circuit 240 comprises enable circuitry 116, a plurality of sense amplifiers 104*a* through 104*d*, and at least one late-select multiplexer 112. The late-select interface circuit 240 may further include a latch 260 coupled to an output 214 of the late-select multiplexer 112. The latch 260, which may be implemented using conventional circuitry (e.g., flip-flop, etc.), serves to at least temporarily store an output of the late-select multiplexer, as in a pipeline register for instance. The latch 260 may also provide a latch boundary for separate logic and memory tests when the late-select interface circuit 240 is configured in a test mode of operation.

The enable circuitry 116 functions, at least in part, to generate control signals, namely, signals RDSX_SA_a, RDSX_SA_b, RDSX_SA_c and RDSX_SA_d, for enabling one or more of the sense amplifiers 104*a* through 104*d* and for deriving control signals, namely, signals RDSX_MUX_a, RDSX_MUX_b, RDSX_MUX_c and RDSX_MUX_d, respectively, used for selectively controlling which input(s) presented to the late-select multiplexer 112 are propagated through the late-select multiplexer. To accomplish this, enable circuitry 116 preferably includes a plurality of sense amplifier enable circuits (SA Enable Logic) 212*a* through 212*d*, each of the sense amplifier enable circuits 212*a* through 212*d* having an output coupled to a control input of a corresponding one of the sense amplifiers 104*a* through 104*d*, respectively. A given sense amplifier may be selectively enabled or disabled in response to the signal presented to its control input. It is to be appreciated that alternative circuits may be employed for implementing the functionalities of the enable circuitry 116, in accordance with the invention. Likewise, the present invention is not limited to the particular implementation of the sense amplifier enable circuits 212*a* through 212*d*, so long as the sense amplifier enable circuits are configurable for operation in at least one of a low-latency mode and a low-power mode, as will be discussed in further detail herein below.

In accordance with one embodiment of the invention, enable circuitry 116 may comprise a controller (not shown) configurable for selectively operating in at least one of a first mode and a second mode. In the first mode, the controller enables one of the sense amplifiers corresponding to the requested input address and disables the remaining sense amplifiers not corresponding to the requested input address, thereby reducing power consumption in the memory circuit 140. In the second mode, the controller enables substantially all of the sense amplifiers, thereby reducing a latency of the memory circuit 140. The term "controller" as used herein is intended to include any processing device, such as, for example, one that includes a central processing unit (CPU) and/or other processing circuitry (e.g., microprocessor). The controller and/or processing blocks can also be implemented as dedicated circuitry in hardware. Additionally, it is to be understood that the term "controller" may refer to more than one controller device, and that various elements associated with a controller device may be shared by other controller devices.

In order to facilitate testing of one or more portions of the cache memory circuit, the enable circuitry 116 may further include at least one self-test multiplexer 200 and logic, such as, for example, AND gates 210*a* through 210*d*. The self-test multiplexer 200 includes a plurality of inputs, a first set of inputs being coupled to way-select signals A through D and a second set of inputs being coupled to a decoded self-test address (ST ADDR) presented thereto. The self-test multiplexer 200 also includes a control input for receiving a control signal TESTM. When the control signal TESTM is enabled (e.g., logic high), such as during a test mode of operation, the decoded self-test address is preferably operatively connected to corresponding outputs n5_a through n5_d, respectively, of the self-test multiplexer and the way-select signals are disconnected from the outputs of the self-test multiplexer. Thus, when control signal TESTM is enabled, the way-select signals do not pass through the self-text multiplexer 200 and therefore do not affect the selection of inputs to the late-select multiplexer 112. Likewise, when the control signal TESTM is disabled (e.g., logic low), such as during the system mode of operation of the late-select interface circuit 240, the way-select A through D signals are operatively connected to corresponding to outputs n5_a through n5_d, respectively, of the self-test multiplexer 200 and the decoded self-test address is disconnected from the outputs of the self-test multiplexer.

The outputs of the self-test multiplexer 200 are preferably logically ANDed together with corresponding outputs RDSX_SA_a through RDSX_SA_d from the sense amplifier enable circuits 212*a* through 212*d* to generate the signals RDSX_MUX_a through RDSX_MUX_d, respectively, used to control which input to the late-select multiplexer 112 is propagated to the output 214. While AND gates 210*a* through 210*d* are not necessary for performing the methodologies of the present invention, they may facilitate the orderly transfer of data from the sense amplifiers 104*a*–104*d* through the late-select multiplexer 112. Hence, the AND gates 210*a* through 210*d* help control circuit timing to reduce power consumed by the late-select multiplexer 112 and the latch 260.

As apparent from FIGS. 1 and 2A, each of the sense amplifiers 104*a* through 104*d* includes at least one input that is coupled to a corresponding bit line BL_a through BL_d, respectively, in the memory array 114. In order to reduce noise during the read operation, among other benefits, at least a portion of the memory array 114 may employ a differential bit line arrangement, whereby each bit line BL_a through BL_d may, in fact, comprise two bit lines, e.g., representing true and complement bits. Assuming such differential arrangement is employed for the memory array 114, outputs RDBL_a through RDBL_d of sense amplifiers 104*a* through 104*d*, respectively, may also comprise corresponding true and complement lines. This differential data path is preferably continued through the late-select multiplexer 112, and to the output OUT of latch 260, if used.

A tag search generally resolves whether the cache data RAM 150 contains the data corresponding to a requested address 106. The address request presented to the cache memory circuit 140 produces a hit or a miss, as previously explained. A hit indicates that the cache data RAM 150 contains the requested data and a miss indicates that the cache data RAM does not contain the requested data. Moreover, for the exemplary set-associative cache memory circuit 140, the compare logic, which comprises comparators 120*a* through 120*d*, further identifies which way holds the requested data. The way hit or miss information propagates to the late-select interface circuit 240 via the way-select signals A through D.

In the exemplary cache memory circuit 140, a logic high way-select signal may be defined as representing a cache hit and a logic low way-select signal may be defined as representing a cache miss, although alternative signal designations may be similarly employed. Only one of the plurality of way-select signals can indicate a hit during any given memory access cycle. The plurality of way-select signals A through D may all be low for a miss in the cache, or one of the way-select signals A through D may be high for a hit in the cache. It is to be appreciated that although the overall cache may hit, an individual way can miss. In a low-power mode of operation of the exemplary cache memory circuit 140, given a hit, one of way-select signals A through D preferably steers the corresponding interleaved way data A through D, residing in the memory array 114 of the cache data RAM 150, through the late-select multiplexer 112 and to the output OUT. The latch 260, when used, preferably holds the data corresponding to the selected way until the next address request is processed.

With continued reference to FIG. 1, the late-select interface circuit 240 includes a control input for receiving a sense amplifier enable (SAE) signal. The late-select interface circuit 240 is configurable so as to selectively control an internal timing of the late-select interface circuit to provide a low-latency mode of operation, a low-power mode of operation, or a combination thereof in response to at least the SAE signal. For example, in accordance with the invention, when the SAE signal is at a first logic level (e.g., logic high), the late-select interface circuit 240 is configured in a first mode of operation (e.g., low-latency mode). Likewise, when the SAE signal is at a second logic level (e.g., logic low), the late-select interface circuit 240 may be configured in a second mode of operation (e.g., low-power mode).

The SAE signal may be generated by various methodologies, in accordance with the present invention. For example, the logical state of the SAE signal may be fixed prior to the system mode of operation of the memory circuit, such as, but not limited to, by selectively blowing electrical fuses (e.g., during wafer probe or prepackage testing) or by reading a storage register loaded during an initial program load (IPL) procedure. It is also contemplated that the SAE signal may vary dynamically during the system mode of operation in response to at least one characteristic associated with the memory circuit. Such characteristic may include, for example, a physical layout of the circuit, a clock frequency associated with the circuit, a voltage supply applied to the circuit, etc.

Figure 2B:
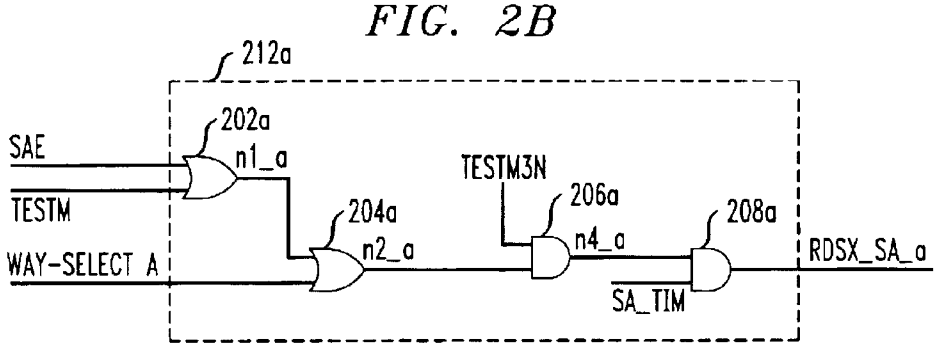
FIG. 2B is a schematic diagram illustrating an exemplary sense amplifier enable circuit that may be employed in the late-select interface circuit of FIG. 2A, in accordance with one embodiment of the present invention.

FIG. 2B illustrates at least a portion of an exemplary sense amplifier enable circuit 212*a* which may be employed in the enable circuitry 116 of the late-select interface circuit 240 shown in FIG. 2A. Although only one of the sense amplifier enable circuits is depicted, sense amplifier enable circuit 212*a* may be similarly employed to implement one or more of the other enable circuits 212*b* through 212*d* and is therefore representative thereof. In the low-latency mode of operation, a logic high SAE signal preemptively enables all sense amplifiers, without regard for the logical state of the way-select signals. The SAE signal is preferably coupled to a first input of a first two-input OR gate 202*a*, while a second input of the OR gate 202*a* may be coupled to a test mode signal TESTM. When SAE is a logic high, such as in a low-latency mode of operation, an output of OR gate 202*a* at node n1_a will be a logic high, regardless of the logical state of the signal TESTM. The output of OR gate 202*a* is preferably connected to a first input of a second two-input OR gate 204*a* and a second input of OR gate 204*a* is coupled to the way-select A signal. It is to be appreciated that, rather than using two two-input OR gates, gates 202*a* and 204*a* can be replaced by a single three-input OR gate serving the same function.

When node n1_a is a logic high, an output of OR gate 204*a* at node n2_a will be a logic high, regardless of the logical state of the way-select A signal. Thus, when any one or more of inputs SAE, TESTM, or way-select A is a logic high, node n2_a will be a logic high level. The output of OR gate 204*a* is preferably coupled to a first input of a first two-input AND gate 206*a*. A second input of the AND gate 206*a* may be connected to another test mode signal TESTM3N. Signal TESTM3N is preferably a logic high during system mode of operation, thereby enabling AND gate 206*a*. During system mode of operation, when node n2_a is a logic high, an output of AND gate 206*a* at node n4_a will also be a logic high. The output of AND gate 206*a* is preferably coupled to a first input of a second two-input AND gate 208*a*. A second input of AND gate 208*a* may be connected to an internal timing signal SA_TIM, which will be described in further detail below. Assuming that signal SA_TIM is a logic high, when node n4_a is a logic high, an output RDSX_SA_a of AND gate 208*a* will be a logic high, thereby enabling the corresponding sense amplifier to which RDSX_SA_a is connected.

As apparent from FIG. 2A, during the low-latency mode, when SAE is a logic high, all way data read from the memory cells (comprised in memory array 114) via the bit lines BL_a through BL_d propagates essentially unencumbered through the corresponding sense amplifiers 104*a* through 104*d* to the RDBL_a through RDBL_d inputs of late-select multiplexer 112, where the RDSX_MUX signals, derivatives of the way-select signals A through D, selectively steer the selected way to the output OUT.

As previously explained, one or more of the sense amplifier enable circuits 212*a* through 212*d* may include an internal timing control input for receiving a sense amplifier timing signal SA_TIM. As apparent from FIG. 2B, when the SA_TIM signal is at a logic low, AND gate 208*a* will effectively be disabled, whereby the output RDSX_SA_a of AND gate 208*a* will remain a logic low regardless of the logical state of the signal developed at node n4_a. In a preferred embodiment of the invention, the signal SA_TIM is generated based, at least in part, on certain characteristics associated with the memory cells in the memory array 114 and/or sense amplifiers 104*a* through 104*d*. For instance, a clock circuit (not shown), or alternative control circuitry used to generate the internal timing signal SA_TIM, may be configured such that the signal SA_TIM transitions to an active state (e.g., logic high) once the data from the memory cells has had an opportunity to develop on the bit lines, thereby allowing sufficient time for the sense amplifiers to read true memory cell data rather than noisy data, resulting from, for example, process mismatches, etc., which may exist in the transistors of the memory cell and sense amplifier circuits. In this manner, the internal timing signal SA_TIM provides control over when the corresponding sense amplifiers are activated.

The SA_TIM signal preferably carries timing information to trigger the sense amplifiers 104*a* through 104*d* at a time when a memory cell connected to bit lines BL_a through BL_d, each of which may comprise differential bit lines BLT and BLC, has developed a substantial differential signal (e.g., Voltage at BLT—Voltage at BLC) to correctly bias the sense amplifier to a one or zero logical state. Signal SA_TIM may be generated, for example, by a clock chopper circuit or by word path tracking circuits (not shown) in the data RAM 150, as will be understood by those skilled in the art.

Alternatively, rather than generating the internal timing signal SA_TIM employed in conjunction with the sense amplifier enable circuits 212*a* through 212*d*, AND gates 210*a* through 210*d* may be configured to operatively delay the output signals RDSX_MUX_a through RDSX_

MUX_d used to select the data path through the late-select multiplexer 112. This allows the sense amplifiers 104*a* through 104*d* additional time to develop the respective signals RDBL_a through RDBL_d presented to the late-select multiplexer 112. The delay may also be generated by separate circuitry (not shown) included between the AND gates 210*a* through 210*d* and the corresponding select inputs of the late-select multiplexer 112. The invention further contemplates that the delay may be selectively varied, for example, as a function of one or more characteristics (e.g., read access time) associated with the memory circuit 140.

With regard to each of the sense amplifier enable circuits, of which enable circuit 212*a* in FIG. 2B is representative, the timing relationship between the internal timing signal SA_TIM and the signal at node n4_a, both of which are used to enable AND gate 208*a*, is preferably controlled such that the derivative of the way-select signal at node n4_a is a logic high, for an active way-select signal (SAE="0" and hit case) or for an unresolved way-select signal (SAE="1" case), or a logic low, for an inactive way-select signal (SAE="0" and miss case), prior to signal SA_TIM becoming a logic high. Thus, a positive edge of the timing signal SA_TIM will preferably enable only the subset of sense amplifiers required to forward the data to the late-select multiplexer 112. In this manner, the sense amplifier will not be erroneously activated. The potential for erroneous activation of the sense amplifier can occur if this timing relationship is not maintained.

During a low-power mode of operation of the memory circuit 140, the SAE signal received at the control input of the sense amplifier enable circuits 212*a* through 212*d* is preferably maintained at a logic low state and therefore does not enable the sense amplifiers. Instead, in a cache "hit" scenario, one of the way-select A–D signals goes high and enables one of the four sense amplifiers 104*a* through 104*d* corresponding thereto. In a cache "miss" scenario, all way-select signals will be a logic low, thereby disabling all sense amplifiers.

Figure 3A:
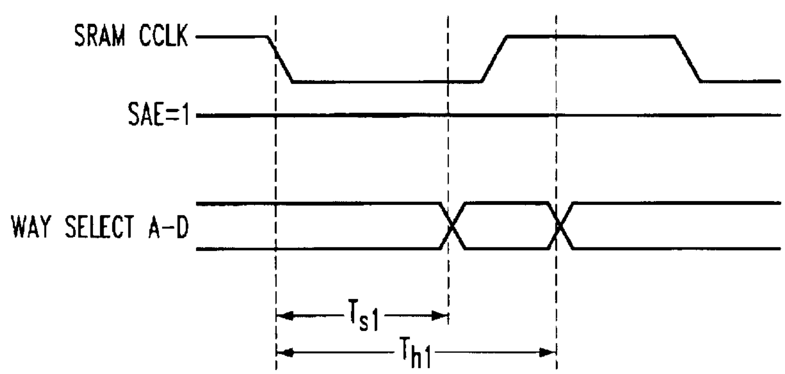
FIGS. 3A and 3B are exemplary timing diagrams illustrating setup and hold times that may be associated with the memory circuit of FIG. 1 for two modes of operation, in accordance with one embodiment of the present invention.
Figure 3B:
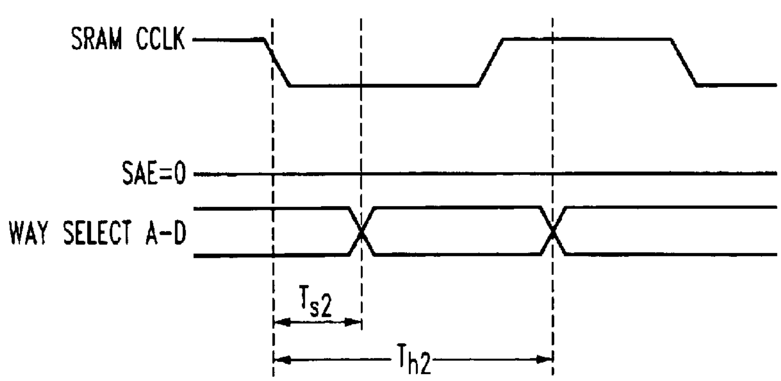

FIGS. 3A and 3B illustrate exemplary timing diagrams depicting setup and hold times that may be associated with the memory circuit of FIG. 1 for low-latency and low-power modes of operation, respectively. From a timing perspective, the assertion of a logic high SAE signal in the low-latency mode significantly relaxes a setup time $T_S$ requirement imposed on the way-select A–D signals that is directed to meeting the timing criteria of the control inputs of the corresponding sense amplifiers. Thus, the sense amplifier enable circuits are preemptively enabled, in the low-latency mode so as to address the concern that the way-select signals may not arrive at the data RAM 150 in time to enable the correct sense amplifier or set of sense amplifiers. A discussion of the timing for low-latency and low-power modes of operation follows.

As apparent from FIG. 3A, in the low-latency mode of operation, which may be initiated in response to a logic high SAE signal received by the sense amplifier enable circuits, a setup time $T_{S1}$ corresponding to the way-select A–D signals is measured in relation to a falling (or rising) edge of the SRAM clock CCLK. The setup time $T_{S1}$ ensures that way-select signal transitions occur such that the outputs of the self-test multiplexer 200 at nodes n5_a through n5_d transition before the outputs RDSX_SA_a through RDSX_SA_d of the sense amplifier enable circuits 212*a* through 212*d* rise at corresponding AND gates 210*a* through 210*d* (see FIG. 2A). For proper functionality, only one of the way-select signals should remain high after this setup time $T_{S1}$ for a valid read to occur.

A hold time $T_{h1}$ corresponding to the way-select A–D signals may also be measured with respect to the falling (or rising) edge of the SRAM clock CCLK. The hold time $T_{h1}$ ensures that the way-select A–D signals hold their state so that the outputs of the self-test multiplexer 200 at nodes n5_a through n5_d do not change state until the outputs RDSX_SA_a through RDSX_SA_d of the sense amplifier enable circuits 212*a* through 212*d*, respectively, have transitioned low at corresponding AND gates 210*a* through 210*d*.

As shown in FIG. 3B, in the low-power mode of operation, which may be initiated in response to a logic low SAE signal received by the sense amplifier enable circuits, a setup time $T_{S2}$ corresponding to the way-select A–D signals is measured in relation to a falling (or rising) edge of the SRAM clock CCLK. A tradeoff for the savings in power achievable in the low-power mode, in comparison to the low-latency mode described above, is that the setup time $T_{S2}$ for the low-power mode is substantially smaller than the setup time $T_{S1}$ for the low-latency mode. This timing relationship ensures that the way-select signal transitions occur such that the way-select signal path input to corresponding AND gates 208*a* through 208*d* at nodes n4_a through n4_d, respectively, transition before the internal sense amplifier timing signal SA_TIM transitions at the input to AND gates 208*a* through 208*d*. For proper functionality, only one of the way-select signals should remain high after this setup time $T_{S2}$ for a valid read to occur.

A hold time $T_{h2}$ corresponding to the way-select A–D signals may also be measured with respect to the falling (or rising) edge of the SRAM clock CCLK. The hold time $T_{h2}$ ensures that way-select A–D signals hold their state such that the outputs of the self-test multiplexer 200 at nodes n5_a through n5_d do not change state until the outputs RDSX_SA_a through RDSX_SA_d of the sense amplifier enable circuits 212*a* through 212*d* have transitioned low at corresponding AND gates 210*a* through 210*d*.

In order to facilitate testing of the memory circuit 140, for example during wafer probing or post-packaging testing of the memory circuit, at least one of the tag RAM 130 and the data RAM 150 is preferably configurable for operating in a test mode in response to one or more control signals presented thereto, such as, for example, signals TESTM and TESTM3N and a decoded self-test address, as previously stated. The decoded self-test address input 216 of the self-test multiplexer 200 shown in FIG. 2A provides a test path for evaluating the cache data RAM 150. The memory array 114 in the data RAM 150 may comprise array buit-in self-test (ABIST) circuitry (not shown). As will be understood by those skilled in the art, ABIST circuitry is special-purpose built-in hardware that generally exercises data, address, and/or clock paths in a memory circuit to ensure that the memory circuit is functional.

While in one test mode of operation (e.g., when test mode signals TESTM, TESTM3N are high), read and/or write operations, which may traverse various address sequences defined by the ABIST, may be performed on the cache data RAM 150. In this first test mode of operation, the data RAM 150 is preferably configured as a traditional RAM, with the self-test multiplexer 200 sourcing decoded self-test addresses 216, which may comprise a portion of the total address generated by the ABIST, to late-select multiplexer 112. Additionally, the selective gating of the sense amplifiers 104*a* through 104*d* by way-select signals A through D, used to minimize power consumption in the low-power mode of the system mode, is disabled in test mode so that the ABIST can operate independently of the way-select logic feeding the data RAM 150. Instead, all sense amplifiers 104*a* through 104*d* are preferably enabled by the TESTM signal via the corresponding sense amplifier enable circuits 212*a* through 212*d*, assuming signal TESTM3N is enabled (e.g., logic high). This first test mode is often referred to as memory test in the art.

In most very large scale integration (VLSI) chips and/or systems comprising embedded memory, memory and logic tests are generally performed independently of one another. In one embodiment of the invention, the memory circuit 140 comprises logic test circuitry built into the sense amplifier enable circuits 212*a* through 212*d*, such as, for example, AND gates 206*a* through 206*d*. The logic test circuitry is preferably only employed during a second test mode of operation to enable testing of combinational logic driven by data cache RAM 150. In logic test mode, a logic low TESTM3N signal preferably disables the late-select multiplexer 112 by disabling signals RDSX_SA_a through RDSX_SA_d, and hence prevents the data from the memory array from contaminating stimulus data loaded into the data RAM output latch 260 via, for example, a conventional scan operation intended for testing downstream combinational logic, as will be known by those skilled in the art. The present invention similarly contemplates various alternative test circuitry and architectures that may be utilized in the memory circuit 140 and/or in conjunction therewith.

Figure 4:
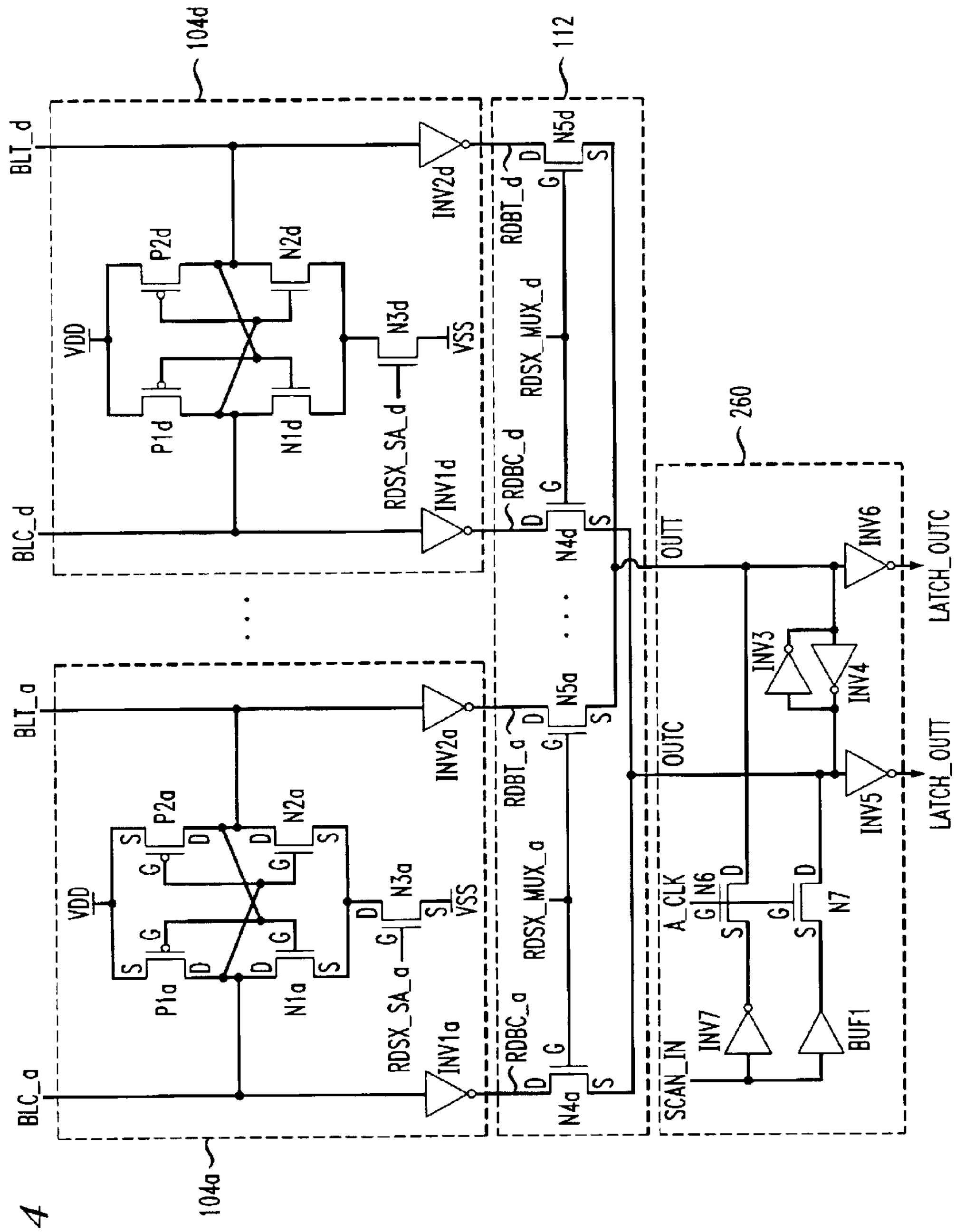
FIG. 4 is a schematic diagram illustrating an exemplary transistor-level implementation of output circuitry that may be employed in the memory circuit of FIG. 1, in accordance with one embodiment of the present invention.

FIG. 4 depicts an exemplary transistor-level implementation of a data output portion of the late-select interface circuit 240 depicted in FIG. 2A. The data output portion may comprise sense amplifiers 104*a* through 104*d*, late-select multiplexer 112 and latch 260. It is to be appreciated that the present invention is not limited to this or any transistor implementation, and that alternative implementations of the late-select interface circuit 240 suitable for use with the invention are similarly contemplated. Moreover, although the illustrative transistor implementation depicted in FIG. 4 employs metal-oxide-semiconductor (MOS) transistor devices, the late-select interface circuit 240 may comprise alternative devices, such as, for example, bipolar junction transistors (BJTs), junction field-effect transistors (JFETs), etc.

Each of the sense amplifiers 104*a* through 104*d*, of which sense amplifier 104*a* is representative, preferably includes an N-type metal-oxide-semiconductor (NMOS) transistor N3*a* used to enable the sensing function in response to a control signal RDSX_SA_a presented to a gate (G) of transistor N3*a*. The sense amplifier 104*a* further includes P-type metal-oxide-semiconductor (PMOS) latching transistors P1*a* and P2*a*, and NMOS latching transistors N1*a* and N2*a* which are configured in a cross-coupled arrangement so as to provide positive feedback for amplifying the small differential signal developed by a memory cell between bit lines BLC_a and BLT_a. The sense amplifier converts this small differential signal into two single-ended signals having enough dynamic range to drive inverters INV1*a* and INV2*a*. Inverters INV1*a* and INV2*a* will then generate a logic high or logic low signal on output nodes RDBC_a and RDBT_a, respectively, to drive inputs of the late-select multiplexer 112.

In the illustrative transistor-level implementation, sources (S) of transistors P1*a* and P2*a* are coupled to the positive voltage supply, which may be VDD. Drains (D) of transistors P1*a* and N1*a* are connected to one of the input bit lines BLC_a. Likewise, the drains of transistors P2*a* and N2*a* are connected to another of the bit lines BLT_a. The sources of transistors N1*a* and N2*a* are connected to the drain of transistor N3*a*. Gates of transistors P1*a* and N1*a* are connected to the drains of transistors P2*a* and N2*a*. Likewise, gates of transistors P2*a* and N2*a* are connected to the drains of transistors P1*a* and N1*a*. The source of transistor N3*a* is connected to the negative voltage supply, which may be VSS.

The late-select multiplexer 112 preferably comprises a plurality of NMOS transistors N4*a* and N5*a* through N4*d* and N5*d*. The multiplexer 112 employs a differential signal path, and therefore a pair of transistors (e.g., N4*a* and N5*a*) are used for each corresponding way. The gates of transistors N4*a* and N5*a* are connected together and form a select input for receiving select signal RDSX_MUX_a. The drain of transistor N4*a* is connected to a complement data input of the multiplexer 112 for receiving signal RDBC_a generated at an output of inverter INV1*a*. Likewise, the drain of transistor N5*a* is connected to a true data input of the multiplexer 112 for receiving signal RDBT_a generated at an output of inverter INV2*a*. The sources of transistors N4*a* and N5*a* are connected to outputs OUTC and OUTT of the late-select multiplexer 112.

The latch 260 in the illustrative transistor-level implementation comprises a storage element formed by a pair of inverters INV3 and INV4 connected such that an input of one inverter is coupled to an output of the other, and vice versa. The input of inverter INV3 and the output of inverter INV4 are connected to the complement output OUTC of the multiplexer 112. Likewise, the output of inverter INV3 and the input of inverter INV4 are connected to the true output OUTT of the multiplexer 112. Latch 260 includes a pair of inverters INV5 and INV6 each having an input connected to the complement and true outputs OUTC and OUTT, respectively.

For testing purposes, the latch 260 may further comprise a scan port, including inverter INV7, buffer BUF1, and NMOS transistors N6 and N7. Transistors N6 and N7 function as pass transistors, much like transistors N4*a* and N5*a*, providing a data port, in addition to those provided by late-select multiplexer 112, to RAM output latch 260. A scan port input SCAN_IN connects to an input of inverter INV7 and an input of buffer BUF1 which generate complement and true signals that, in a scan mode of operation, operatively write the internal latch formed by INV3 and INV4. An output of inverter INV7 is connected to a source of transistor N6 and an output of buffer BUF1 is connected to a source of transistor N7. The gates of transistors N6 and N7 are connected to a clock input A_CLK. The drains of transistors N6 and N7 are connected to true and complement outputs OUTT and OUTC of the multiplexer 112, respectively. As will be understood by those skilled in the art, since MOS transistors are essentially bi-directional devices, the designation of the source and drain terminals of the transistors is arbitrary, and thus may be reversed without affecting functionality.

During testing, operating in what is known in the art as a scan mode, an A_CLK signal transfers a signal from the SCAN_IN input to the latch nodes OUTT and OUTC via pass transistors N6 and N7, respectively. The A_CLK signal, often referred to as "A clock" in the art, is preferably one of two clocks that load stimulus data into and retrieve results data from shift registers (not shown) which may be included in latch 260.

By way of example only, the following discussion will illustrate an operation of the illustrative circuit shown in FIG. 4, assuming a scenario in which way-select signal A hits. Prior to the initiation of a read operation, bit lines BLC_a and BLT_a are preferably precharged to a logic high state. Once the read operation is initiated, a selected memory cell will preferably discharge either complement bit line BLC_a or true bit line BLT_a at a relatively slow rate (e.g. about 2 nanoseconds (ns)). The sense amplifier 104*a* speeds the signal development once a substantially reliable differential signal develops between nodes BLC_a and BLT_a. A logic high input on what has been referred to as the enable input of the sense amplifier 104*a*, corresponding to signal RDSX_SA_a, enables transistor N3*a* which connects the source terminals of transistors N1*a* and N2*a* to ground and thus initiates a latching/amplification action.

Once full range signals RDBC_a, RDBT_a are established by the sense amplifier 104*a* at the corresponding inputs to the late-select multiplexer 112, one high and the other low (complement), the select input RDSX_MUX_a of the late select multiplexer 112 (corresponding to way A) can be enabled. One of the two transistors N4*a*, N5*a* will pull one of nodes OUTC and OUTT low and the other transistor will pull the other node weakly high, thereby overwriting the prior state held in the internal latch formed by inverters INV3 and INV4. Inverters INV5 and INV6 re-drive and re-power the complementary signals providing substantial current gain to drive nodes LATCH_OUTT and LATCH_OUTC, respectively.

Figure 5:
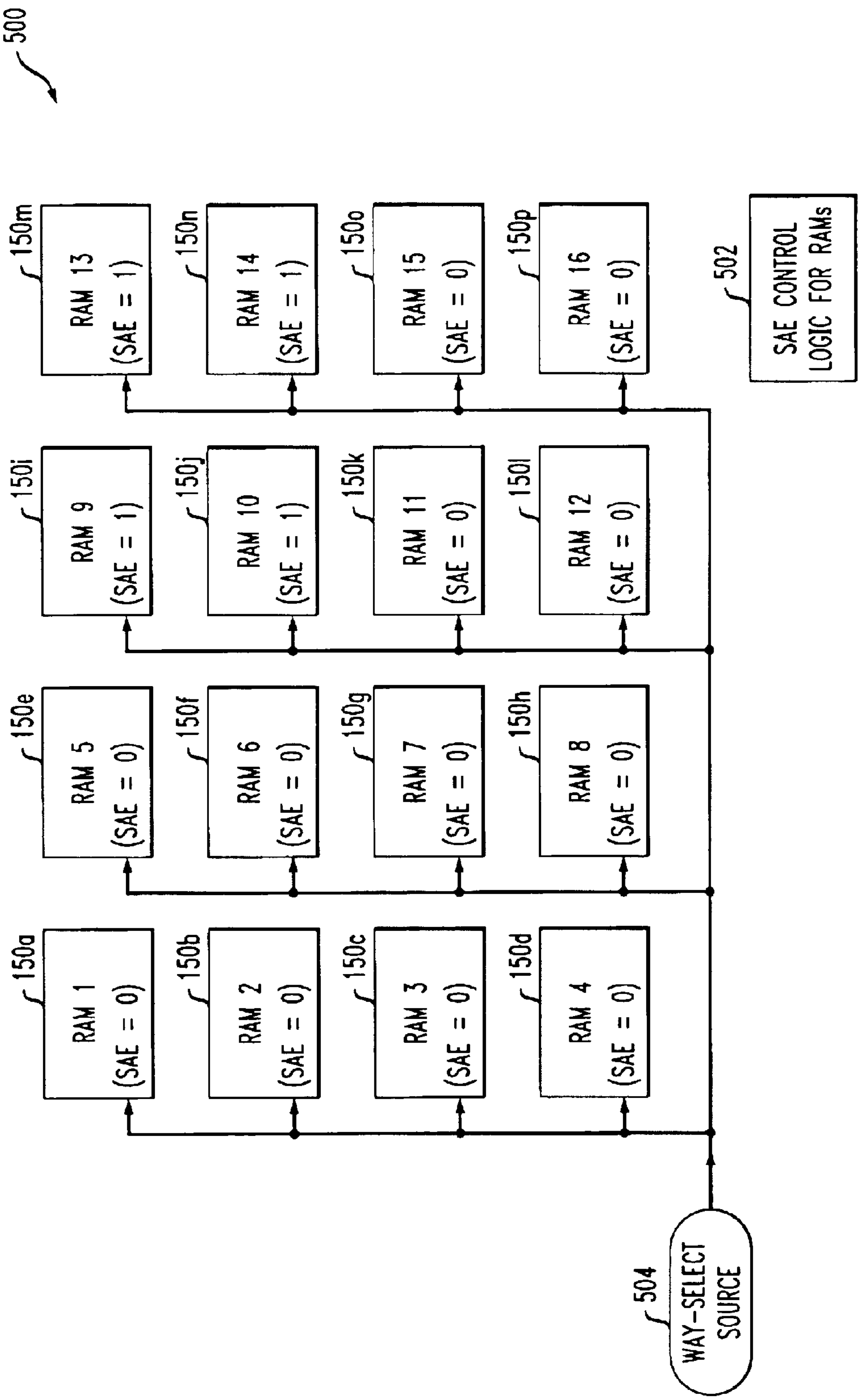
FIG. 5 is a block diagram of an exemplary memory circuit layout illustrating a utility of the sense amplifier enable inputs as they apply to distributed late-select RAMs in realizing a compromise between timing and power management goals, in accordance with the invention.

FIG. 5 depicts an exemplary data RAM memory array 500 comprising a plurality of late-select RAMs 150*a* through 150*p*, with at least one of the late-select RAMs (e.g., 150*m*) configured in a low-latency mode, where SAE is set to a high logic state (i.e., "1") and at least one of the late-select RAMs (e.g., 150*d*) configured in a low-power mode, where SAE is set to a logic low (i.e., "0"). It is to be appreciated that the present invention is not limited to the precise embodiment shown, nor is it limited to the number of late-select RAMs comprised in the array.

In the exemplary memory array 500, the logical state of the SAE signal is set, in one aspect, according to a physical layout of each late-select RAM with respect to a source of the way-select signals 504. In this manner, the memory array 500 can be selectively configured to advantageously account for delays (e.g., time-of-flight) existing along wires connecting the particular late-select RAM to the way-select signal source 504. Thus, remote late-select RAMs located at a relatively long distance from the way-select signal source 504, such as, for example, late-select RAM 150*m*, are preferably set to operate in the low-latency mode (e.g., SAE=1) in order to meet timing constraints. Similarly, more localized late-select RAMs located at a relatively close distance from the way-select signal source 504, are preferably set to operate in the low-power mode (e.g., SAE=0) in order to minimize power consumption. A cache arranged in this manner can therefore be configured to provide a low latency while consuming minimal power. In addition, the SAE signals can be controlled dynamically or statically, for example by control circuitry 502 operatively coupled to the late-select RAMs 150*a* through 150*m*, as previously stated.

The time required to generate the way-select signals from the tag compare results is, at least in part, a function of certain characteristics associated with the memory circuit, such as, for example, process technology variations, frequency of operation, supply voltage, temperature, etc. To enable the sense amplifiers of a desired way without utilizing the SAE signal, a designer must guarantee that the compare results are available in time to gate the sense amplifiers across the full spectrum of operating conditions and/or process variations. The ability to selectively control the mode of operation (e.g., low-latency or low-power) of a given late-select RAM advantageously allows a single late-select RAM design to be used to save power when operating conditions yield compare results that are sufficiently fast enough to gate the sense amplifiers of the late-select RAMs and to still operate correctly when the compare results are not available in time to gate the sense amplifiers.

There are certain instances when the application itself has control over one or more of the operating conditions associated with the memory circuit. For example, the clock frequency can be altered via control signals to a phase-locked loop (PLL), supply voltage can be changed via a voltage regulator, temperature can be changed by controlling an output of a cooling device. Under these and other circumstances, the timing constraints of the late-select RAM can be controlled dynamically and/or statically, e.g., by blowing fuses which permanently control the configuration of a given late-select RAM, by loading a data register which may individually control the timing modes of each of the late-select RAMs, or a combination thereof, in accordance with another aspect of the invention.

Figure 6:
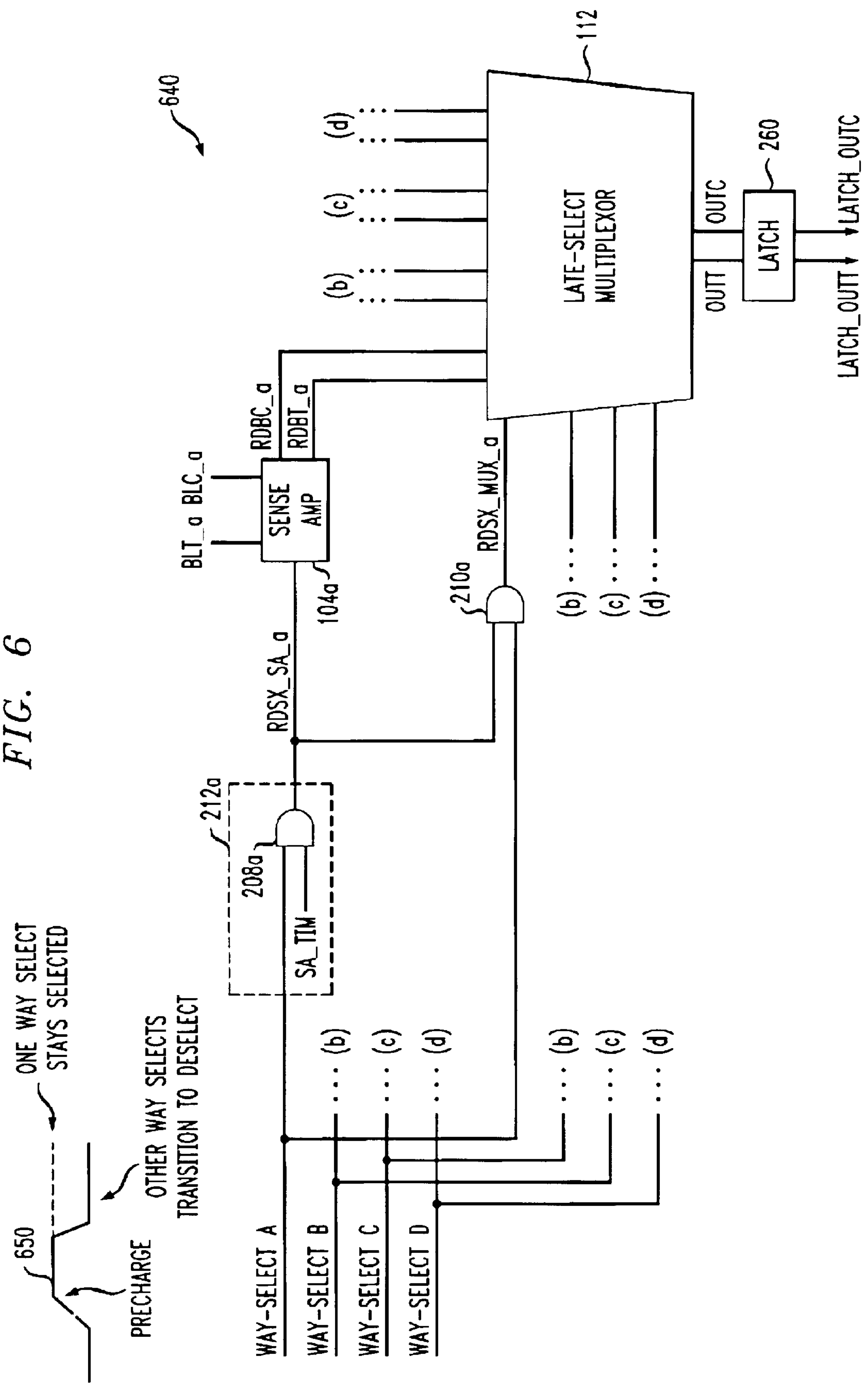
FIG. 6 is a schematic diagram illustrating a simplification for the late-select interface circuit of FIG. 2A, in accordance with another embodiment of the present invention.

FIG. 6 illustrates an alternative late-select interface circuit 640, formed in accordance with a preferred embodiment of the present invention. The last-select interface circuit 640 comprises a simplified version of the exemplary late-select interface circuit 240 shown in FIG. 2A. With reference to FIG. 6, the details of only one way path (way A) are shown for ease of explanation. It will be assumed that circuit components associated with the other way paths, namely, ways B through D, are substantially identical to way path A and therefore will not be described herein. Furthermore, as apparent from the figure, the circuitry used during a test mode of operation, such as, for example, self-test multiplexer 200 shown in FIG. 2A, has been omitted for simplification. It is to be appreciated that the late-select interface circuit 640 shown in FIG. 6 is merely exemplary, and that the present invention is not limited to this or any particular circuit arrangement.

Like the late-select interface circuit 240 shown in FIG. 2A, late-select interface circuit 640 includes a plurality of sense amplifiers (SA), of which sense amplifier 104*a* is representative, each sense amplifier corresponding to a given way, a plurality of corresponding sense amplifier enable circuits, of which enable circuit 212*a* is representative, at least one late-select multiplexer 112, and late-select multiplexer select logic, of which AND gate 210*a* is representative. The late-select circuit 640 may further include a latch 260, or alternative circuitry, coupled to the output(s) of the late-select multiplexer 112 for at least temporarily storing the output state of the late-select multiplexer. As previously stated, the self-test multiplexer 200 shown in FIG. 2A is not depicted in FIG. 6, although to facilitate testing, such circuitry or a suitable alternative thereof may be included in the late-select interface circuit 640, as will be understood by those skilled in the art.

An important benefit of the exemplary late-select interface circuit 640 is that late-select interface circuit 640 is able to concurrently operate in both a low-latency mode and a low-power mode, in accordance with one aspect of the invention. Moreover, late-select interface circuit 640 is configured so as to guarantee low-latency while concurrently minimizing power consumption in the circuit, without the requirement of the SAE signal to ensure proper activation of the sense amplifiers. In this manner, the sense amplifier enable circuitry 212*a* can be substantially simplified to include just two-input AND gate 208*a*. To accomplish this, the comparators 120*a* through 120*d* (see FIG. 1) are preferably configured for providing a precharge mode, whereby all way-select signals, namely, way-select A through D, are initially precharged to an active state, in this case a logic high level. An explanation of the precharge embodiment of FIG. 6 will be explained in further detail below.

In enable circuit 212*a*, a first input of AND gate 208*a* is coupled to the way-select A signal generated by the corresponding comparator 120*a* (see FIG. 1) and a second input of AND gate 208*a* is coupled to the internal timing signal SA_TIM. The SA_TIM signal may be the same signal as that previously described herein in connection with FIG. 2B. In order for the RDSX_SA_a signal generated at an output of AND gate 208*a* to become active (designated herein as a logic high), and thereby activate the corresponding sense amplifier 104*a*, both the first and second inputs of AND gate 208*a* must be a logic high. While not a requirement for the system mode of operation, additional circuitry may be included in the enable circuit 212*a* for testing purposes, an example of which is shown in FIG. 2B.

In order for late-select interface circuit 640 to substantially guarantee a low-latency operation of the memory circuit, the way-select signals A through D are preferably precharged to a logic high prior to the arrival of an active (e.g., logic high) internal timing signal SA_TIM. A precharge state of a given way-select signal can be initiated, for example, concurrently with the access of the tag array 130 (see FIG. 1), well in advance of the resolution of the way-select signals. Thus, the SAE concept is inherently integrated into the way-select signals as a result of the novel precharge condition. Once the way-select signals have all been precharged, each way-select signal is independently allowed to either transition to a logic low level (indicating an inactive state) or to remain at a logic high (indicating an active state), depending on the outcome of the way-select resolution. This is illustrated by exemplary logic signal 650. The dotted line represents the active way-select signal, and the solid line represents the inactive way-select signal.

When a cache hit is detected, all way-select signals are initially precharged high to an active state and, following the way resolution, all way-select signals except one (corresponding to the matching way) will transition low corresponding to an inactive state. The way-select signal corresponding to the matching way remains high. When a cache miss is detected, all way-select signals will transition low to an inactive state following the way resolution. A unique aspect of the signal 650 is that the precharge phase essentially provides the equivalent function of the SAE signal. Thus, as long as the precharge phase of the way-select signals meet the setup time requirement for the select inputs to the late-select multiplexer 112 (specified as $T_{S2}$ in FIG. 3B), the functionality of the late-select interface circuit 640 is substantially guaranteed.

Power consumption in late-select interface circuit 640 can be substantially minimized, at least compared to the late-select interface circuit 240 shown in FIG. 2A, without sacrificing latency since one of the sense amplifiers associated with the selected way is always enabled while the other sense amplifiers associated with the unselected ways may or may not be disabled by the respective falling way-select signals. Whether or not the sense amplifier associated with an unselected way is disabled will depend primarily on whether or not the way resolution is completed in time, that is, whether or not the falling edge of signal 650, corresponding to one or more of the unselected ways, arrives before or after the rising edge of SA_TIM. If the way select signal falls before the rise of SA_TIM, the sense amplifier is deselected, and power is saved. If it arrives after SA_TIM, power is consumed by the sense amplifier corresponding to the unselected way.

Assuming the way resolution is not completed in time for the arrival of the internal timing signal SA_TIM, the sense amplifiers will not be required to wait for the way-select signals to develop in order to be enabled, since the way-select signals are initially precharged to an active state. While the late-select interface circuit 640 still functions correctly without stalling the data, it does consume additional sense amplifier power. When the way resolution does complete in time, the way-select signals corresponding to unselected ways will have transitioned low prior to the arrival of the SA_TIM signal, thereby disabling the corresponding sense amplifiers and minimizing power consumption in the circuit. In the late-select interface circuit 240 of FIG. 2A, by contrast, in order to guarantee the lowest latency the SAE signal must be active (e.g., logic high), thereby enabling all sense amplifiers without regard to the timing of an actual way select signal.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A random access memory circuit, comprising:

a plurality of memory cells;

at least one decoder coupled to the memory cells, the at least one decoder being configurable for receiving an input address and for accessing one or more of the memory cells in response thereto;

a plurality of sense amplifiers operatively coupled to the memory cells, the sense amplifiers being configurable for determining a logical state of one or more of the memory cells; and a controller coupled to at least a portion of the sense amplifiers, the controller being configurable for selectively operating in at least one of a first mode and a second mode, wherein in the first mode the controller enables one of the sense amplifiers corresponding to the input address and disables the sense amplifiers not corresponding to the input address, and in the second mode the controller enables substantially all of the sense amplifiers.

2. The memory circuit of claim 1, wherein the controller dynamically changes the operating mode in response to at least one characteristic associated with the memory circuit.

3. The memory circuit of claim 2, wherein the at least one characteristic comprises at least one of a physical layout of the memory circuit, a clock frequency associated with the memory circuit, and a voltage supply associated with the memory circuit.

4. The memory circuit of claim 1, wherein the first mode comprises a power-saving mode and the second mode comprises a low-latency mode.

5. The memory circuit of claim 1, further comprising at least one multiplexer operatively coupled to at least a portion of the plurality of sense amplifiers, the multiplexer including at least one control input for receiving a select signal, the multiplexer connecting one of the sense amplifiers coupled thereto to an output of the multiplexer in response to the select signal.

6. The memory circuit of claim 5, further comprising a latch circuit coupled to the output of the at least one multiplexer, the latch circuit at least temporarily storing an output of one of the sense amplifiers.

7. The memory circuit of claim 1, wherein the controller comprises a plurality of sense amplifier enable circuits, each of the sense amplifier enable circuits corresponding to a given one of the sense amplifiers, each of at least a portion of the plurality of sense amplifier enable circuits receiving a timing signal for selectively disabling the corresponding sense amplifier coupled thereto while the timing signal is inactive.

8. The memory circuit of claim 7, wherein the timing signal is a function of one or more characteristics associated with the memory cells.

9. The memory circuit of claim 7, wherein each of at least a portion of the sense amplifier enable circuits is configured such that the corresponding sense amplifier coupled thereto is disabled during a test mode of operation of the memory circuit.

10. The memory circuit of claim 1, wherein the controller is configurable for receiving a timing signal and a plurality of control signals, each of the control signals corresponding to a given one of the sense amplifiers, each of the sense amplifiers being selectively disabled in response to at least one of the timing signal and the corresponding control signal, the controller being operable in a third mode, wherein each of at least a portion of the control signals is initially set to enable the sense amplifier corresponding thereto during a time period in which a determination is performed as to whether the sense amplifier substantially corresponds to the input address, such that: (i) when the timing signal is set to enable the sense amplifiers before the determination is performed, the corresponding sense amplifier is enabled; and (ii) when the timing signal is set to enable the sense amplifiers after the determination is performed, the corresponding sense amplifier is one of enabled and disabled, depending at least in part on whether or not, respectively, the input address substantially corresponds to the sense amplifier.

11. The memory circuit of claim 1, further comprising at least one test circuit configurable for operatively testing one or more components in the memory circuit during a test mode of operation of the memory circuit.

12. The memory circuit of claim 11, wherein the test circuit comprises a multiplexer, the multiplexer including a first input for receiving a test address and at least a second input for receiving a control signal used to selectively disable one or more of the sense amplifiers, the multiplexer being configurable for connecting the test address to an output of the multiplexer during a test mode of operation of the memory circuit.

13. The memory circuit of claim 1, further comprising:

at least one tag random access memory (RAM), the tag RAM including a plurality of memory cells and a plurality of data ways coupled to the memory cells in the tag RAM; and a plurality of comparators, each of the comparators including a first input coupled to a corresponding one of the data ways, a second input for receiving at least a portion of the input address, and an output coupled to the controller, each of the comparators generating a control signal at its output that is representative of whether an address associated with a corresponding data way in the tag RAM substantially matches the input address.

14. A cache memory circuit, comprising:

a tag random access memory (RAM) including a plurality of memory cells and a plurality of data ways coupled to the memory cells for at least selectively reading a logical state of one or more of the memory cells;

a plurality of comparators, each of the comparators including a first input coupled to a corresponding one of the data ways, a second input for receiving at least a portion of an input address, and an output, each of the comparators generating a control signal at its output that is representative of whether an address associated with a corresponding data way in the tag RAM substantially matches the input address; and a data RAM circuit including:

a plurality of memory cells;

at least one decoder operatively coupled to the memory cells in the data RAM circuit, the at least one decoder being configurable for receiving the input address and for accessing one or more of the memory cells in response thereto;

a plurality of sense amplifiers operatively coupled to the memory cells in the data RAM circuit, the sense amplifiers being configurable for determining a logical state of one or more of the memory cells; and a controller coupled to at least a portion of the sense amplifiers, the controller being configurable for selectively adapting a latency of the cache memory circuit.

15. The cache memory circuit of claim 14, wherein the controller is configured to selectively adapt the latency of the cache memory circuit by at least one of enabling and disabling the sense amplifiers based at least in part on a timing signal received by the controller and on a determination as to whether an address associated with a corresponding data way substantially matches the input address.

16. The cache memory circuit of claim 15, wherein the timing signal is a function of one or more characteristics associated with one or more memory cells in at least the data RAM.

17. The cache memory circuit of claim 14, wherein each of at least a portion of the comparators are configured to generate a control signal at its output that is at least initially set to enable a sense amplifier corresponding thereto during a period in which a determination is made as to whether an address associated with the corresponding data way substantially matches the input address.

18. The cache memory circuit of claim 14, wherein the controller is configurable for receiving a timing signal and the plurality of control signals from the comparators, each of the control signals corresponding to a given one of the sense amplifiers, each of the sense amplifiers being selectively disabled in response to at least one of the timing signal and the corresponding control signal, each of at least a portion of the control signals being initially set to enable the sense amplifier corresponding thereto during a time period in which a determination is performed as to whether the sense amplifier associated with a given one of the data ways substantially corresponds to the input address, such that: (i) when the timing signal is generated before the determination is performed, the corresponding sense amplifier is enabled; and (ii) when the timing signal is generated after the determination is performed, the corresponding sense amplifier is one of enabled and disabled, depending at least in part on whether or not, respectively, the input address substantially corresponds to the data way associated with the sense amplifier.

19. The cache memory circuit of claim 14, wherein the controller dynamically changes the latency of the cache memory circuit in response to at least one characteristic associated with the cache memory circuit.

20. The cache memory circuit of claim 14, further comprising at least one multiplexer operatively coupled to at least a portion of the plurality of sense amplifiers, the multiplexer including at least one control input for receiving a select signal, the multiplexer connecting one of the sense amplifiers coupled thereto to an output of the multiplexer in response to the select signal.

21. The cache memory circuit of claim 14, further comprising at least one test circuit configurable for operatively testing one or more components in the cache memory circuit during a test mode of operation of the memory circuit.

22. A semiconductor device comprising at least one random access memory circuit, the random access memory circuit comprising:

a plurality of memory cells;

at least one decoder coupled to the memory cells, the at least one decoder being configurable for receiving an input address and for accessing one or more of the memory cells in response thereto;

a plurality of sense amplifiers operatively coupled to the memory cells, the sense amplifiers being configurable for determining a logical state of one or more of the memory cells; and a controller coupled to at least a portion of the sense amplifiers, the controller being configurable for selectively operating in at least one of a first mode and a second mode, wherein in the first mode the controller enables one of the sense amplifiers corresponding to the input address and disables the sense amplifiers not corresponding to the input address, and in the second mode the controller enables substantially all of the sense amplifiers.

* * * * *